United States Patent
Huang

(10) Patent No.: US 7,492,597 B2
(45) Date of Patent: Feb. 17, 2009

(54) STRUCTURE FOR COOLING A POWER ADAPTER

(75) Inventor: Ming-Ho Huang, Taipei Hsien (TW)

(73) Assignee: HIPRO Electronics Co., Ltd., Taipei Hsien (TW)

( * ) Notice: Subject to any disclaimer, the term of this patent is extended or adjusted under 35 U.S.C. 154(b) by 246 days.

(21) Appl. No.: 11/493,726

(22) Filed: Jul. 26, 2006

(65) Prior Publication Data

US 2007/0247817 A1  Oct. 25, 2007

(30) Foreign Application Priority Data

Apr. 25, 2006  (TW) .............................. 95207011 U

(51) Int. Cl.
*H05K 7/20* (2006.01)
*H05K 5/00* (2006.01)
(52) U.S. Cl. ..................... 361/719; 361/690; 361/693; 361/714; 454/184; 363/141
(58) Field of Classification Search ................. 361/390, 361/693, 697, 702, 704, 709, 714, 690; 454/184; 363/141
See application file for complete search history.

(56) References Cited

U.S. PATENT DOCUMENTS

| | | | | |
|---|---|---|---|---|
| 5,258,888 A | * | 11/1993 | Korinsky ..................... 361/704 |
| 5,723,858 A | * | 3/1998 | Sugden ................... 250/231.13 |
| 5,831,847 A | * | 11/1998 | Love ........................... 363/141 |
| 6,046,908 A | * | 4/2000 | Feng ........................... 361/707 |
| 6,081,425 A | * | 6/2000 | Cheng ......................... 361/704 |
| 6,411,514 B1 | * | 6/2002 | Hussaini ..................... 361/704 |
| 6,776,650 B2 | * | 8/2004 | Cheng et al. ................. 439/485 |
| 6,820,686 B2 | * | 11/2004 | Yang et al. ................... 165/185 |
| 7,154,755 B2 | * | 12/2006 | Araujo ........................ 361/720 |
| 7,300,302 B2 | * | 11/2007 | Kajiwara et al. ............. 439/485 |
| 2004/0264143 A1 | * | 12/2004 | Chen et al. ................... 361/719 |
| 2005/0248923 A1 | * | 11/2005 | Hsu ............................ 361/704 |
| 2006/0198104 A1 | * | 9/2006 | Chang et al. ................. 361/695 |
| 2007/0053157 A1 | * | 3/2007 | Huang et al. ................. 361/688 |

* cited by examiner

*Primary Examiner*—Jayprakash N Gandhi
*Assistant Examiner*—Zachary M Pape
(74) *Attorney, Agent, or Firm*—Ming Chow; Sinorica, LLC

(57) ABSTRACT

A power adapter includes a housing formed of a bottom cover shell and a top cover shell and having an air passage extending across the bottom cover shell and an exhaust port in the top cover shell, a PC board mounted in the housing, two heat sinks covered on the PC board for absorbing heat from the primary and secondary sides of the PC board respectively for enabling absorbed heat to be carried to the outside of the housing by outside cooling air that is circulating through the exhaust port and the air passage, and a spacer set in the air passage between the heat sinks and working with the heat sinks to protect the PC board against outside dust and water.

9 Claims, 4 Drawing Sheets

STRUCTURE FOR COOLING A POWER ADAPTER

BACKGROUND OF THE INVENTION

1. Field of the Invention

The present invention relates to a power adapter and more particularly, to such a power adapter that has an air passage and at least one exhaust port for causing circulation of cooling air to carry heat away from the internal electronic component parts during operation.

2. Description of the Related Art

Advanced power adapters are small-sized. Therefore, the heat dissipation arrangement in an advanced power adapter is quite important. FIG. 1 is a schematic sectional plain view of a conventional power adapter. According to this design, the power adapter comprises a housing 80, a printed circuit board 81, a plurality of electronic component parts 82, a heat sink 83, and an electric fan 84. The housing 80 has a plurality of air vents (not shown). The heat sink 83 absorbs heat from the electronic component parts 82. The fan 84 causes currents of air to carry heat from the heat sink 83 to the outside open air through the air vents of the housing 80 so as to lower the inside temperature of the power adapter.

According to the aforesaid prior art design, the power adapter uses an electric fan to cause currents of air for lowering the inside temperature. However, the use of the electric fan greatly increases the cost. Further, during the operation of the power adapter, the electric fan causes noises.

Therefore, it is desirable to provide a power adapter that eliminates the aforesaid drawbacks.

SUMMARY OF THE INVENTION

The present invention has been accomplished under the circumstances in view. It is the main object of the present invention to provide a power adapter, which has an air passage and at least one exhaust port for causing circulation of cooling air to carry heat away from the internal electronic component parts during operation.

To achieve this and other objects of the present invention, the power adapter comprises a housing, a printed circuit board, a first heat sink, a second heat sink, and a spacer. The housing comprises a bottom cover shell and a top cover shell covering the bottom cover shell. The bottom cover shell has an inside space, and an air passage extending through two opposite sides thereof and dividing the inside space into a first accommodation chamber and a second accommodation chamber. The top cover shell has at least one exhaust port adapted to guide circulation of outside cooling air through the air passage. The printed circuit board is mounted in the inside space inside the bottom cover shell of the housing and carrying a set of electronic component parts. The first heat sink is mounted in the first accommodation chamber. The second heat sink is mounted in the second accommodation chamber. The spacer is mounted in the air passage and tightly set between the first heat sink and the second heat sink. The first heat sink and the second heat sink respectively absorb heat from the electronic component parts of the printed circuit board in the first accommodation chamber and the second accommodation chamber for enabling absorbed heat to be carried to the outside of the housing by outside cooling air that passes through the at least one exhaust port and the air passage.

DETAILED DESCRIPTION OF THE PREFERRED EMBODIMENT

Figure 1:
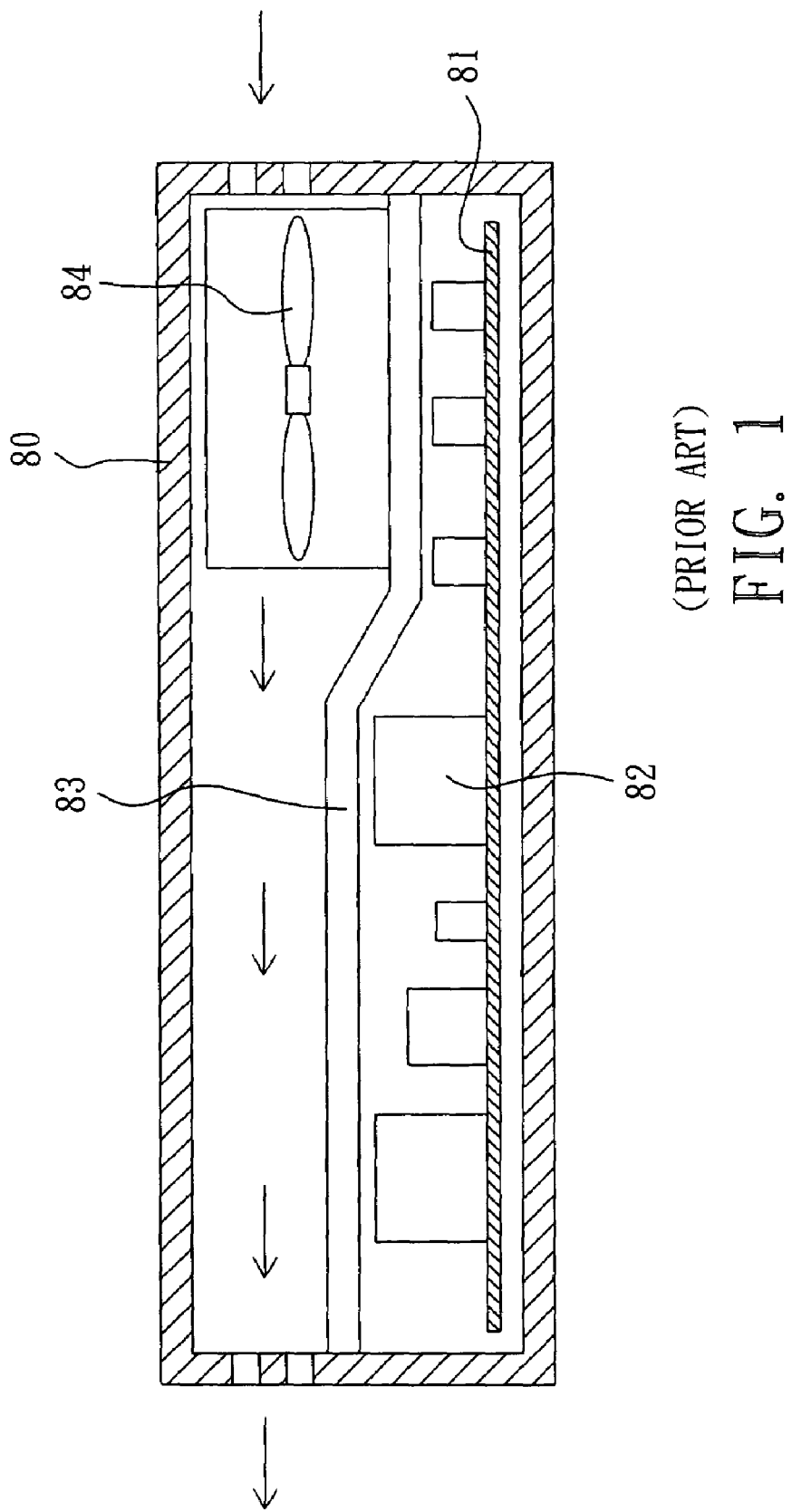
FIG. 1 is a schematic sectional side plain view of a power adapter according to the prior art.
Figure 2:
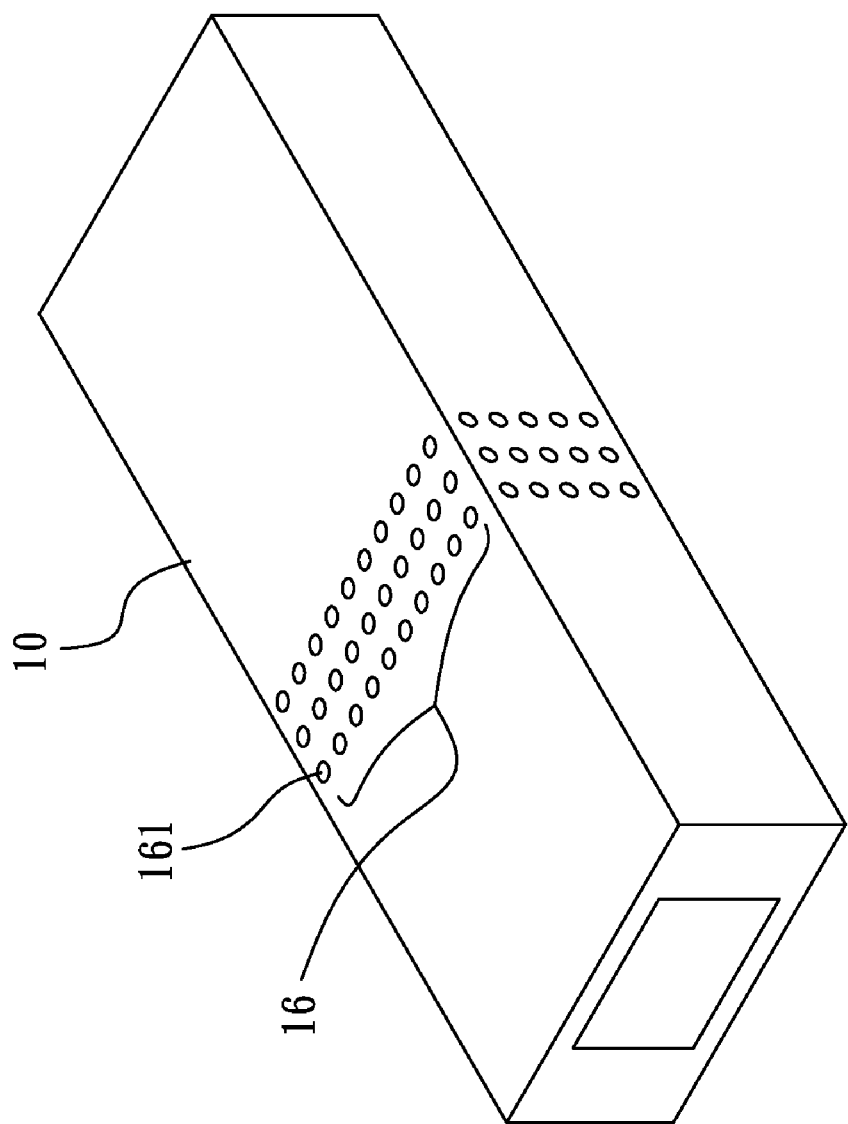
FIG. 2 is an elevational view of a power adapter according to the present invention.
Figure 3:
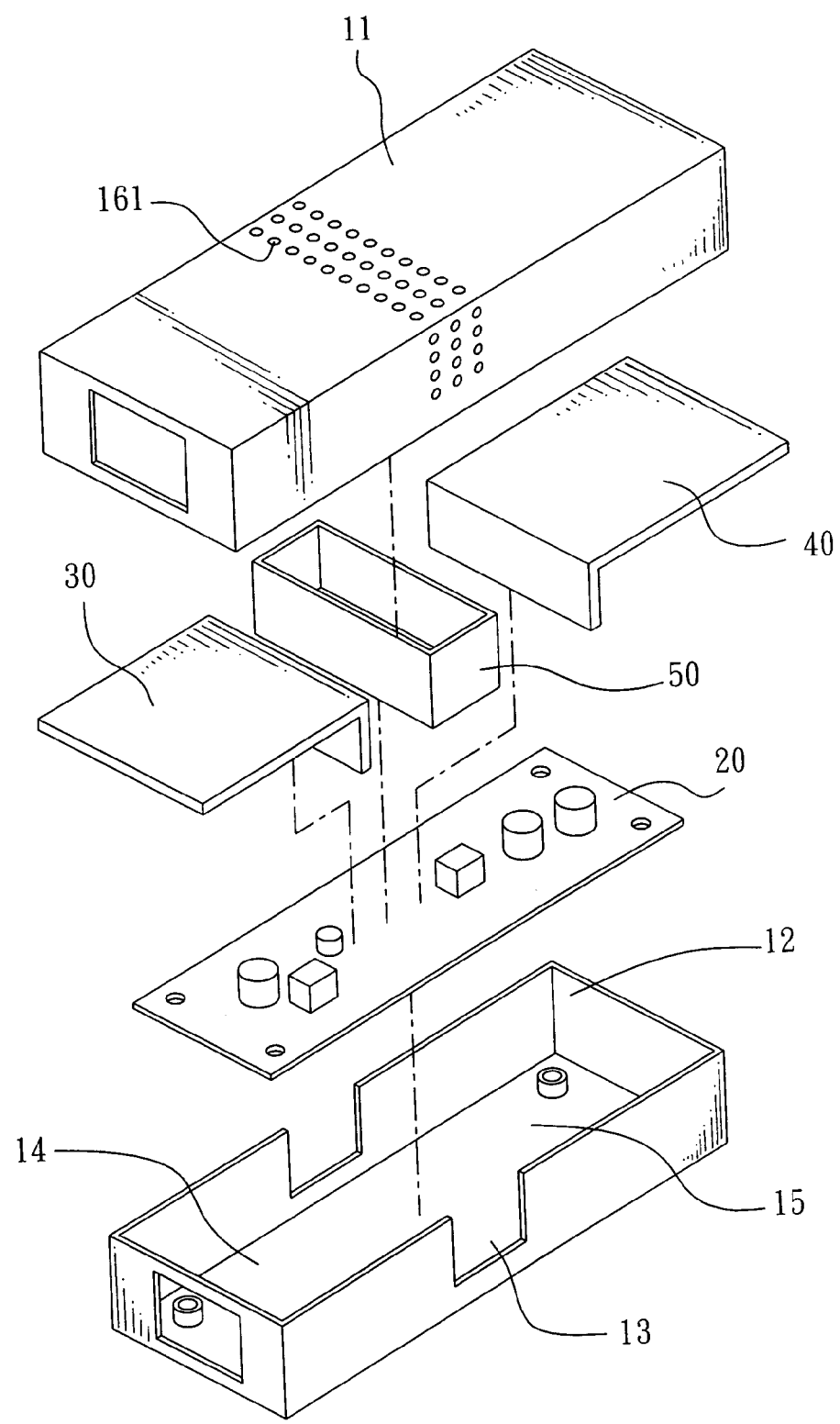
FIG. 3 is an exploded view of the power adapter according to the present invention.

Referring to FIGS. 2 and 3, a power adapter in accordance with the present invention is shown comprising a housing 10, a printed circuit board 20, a first heat sink 30, a second heat sink 40, and a spacer 50.

The housing 10 is preferably made out of electrically insulating material, for example, plastics, comprising a top cover shell 11 and a bottom cover shell 12. The bottom cover shell 12 has an air passage 13 that divides the inside space of the bottom cover shell 12 into a first accommodation chamber 14 and a second accommodation chamber 15. The top cover shell 11 has an exhaust port 16 corresponding to the air passage 13. According to this embodiment, the air passage 13 extends transversely through the middle part of the bottom cover shell 12; the exhaust port 16 is comprised of a plurality of air vents 161 on the top and two opposite lateral sides in three lines.

The printed circuit board 20 is set inside the bottom cover shell 12, having electronic component parts installed therein. According to this embodiment, the first accommodation chamber 14 is smaller than the second accommodation chamber 15, and adapted to accommodate the primary circuit of the power adapter. The second accommodation chamber 15 is adapted to accommodate the secondary circuit of the power adapter.

The first heat sink 30 is made out of metal or any suitable material of high coefficient of heat transfer, and mounted in and covering the first accommodation chamber 14 for dissipating heat from the electronic component parts of the printed circuit board 20 in the first accommodation chamber 14.

The second heat sink 40 is made of metal or any suitable material of high coefficient of heat transfer, and mounted in and covering the electronic component parts of the printed circuit board 20 in the second accommodation chamber 15. Normally, the amount of heat produced by the secondary side is greater than the primary side. Therefore, the second heat sink 40 must be made greater than the first heat sink 30 to fit the heat dissipation demand.

The spacer 50 is mounted in the air passage 13 and tightly set between the first heat sink 30 and the second heat sink 40 on the top side of the printed circuit board 20 so that the heat sinks 30 and 40 and the spacer 50 protect the printed circuit board 20 against outside dust and water. According to this embodiment, the spacer 50 is molded from Mylar, having a U-shaped cross section.

During the assembly process, the printed circuit board 20 is set in the bottom side inside the first accommodation chamber 14 and the second accommodation chamber 15, and then the first heat sink 30 and the second heat sink 40 are respectively covered on the first accommodation chamber 14 and the second accommodation chamber 15, and then the spacer 50 is set in between the first heat sink 30 and the second heat sink 40 on the top side of the printed circuit board 20 to block the inside space of the bottom cover shell 12 and to protect the printed circuit board 20 against outside dust and water, and at the final the top cover shell 11 is covered on the bottom cover shell 12.

Figure 4:
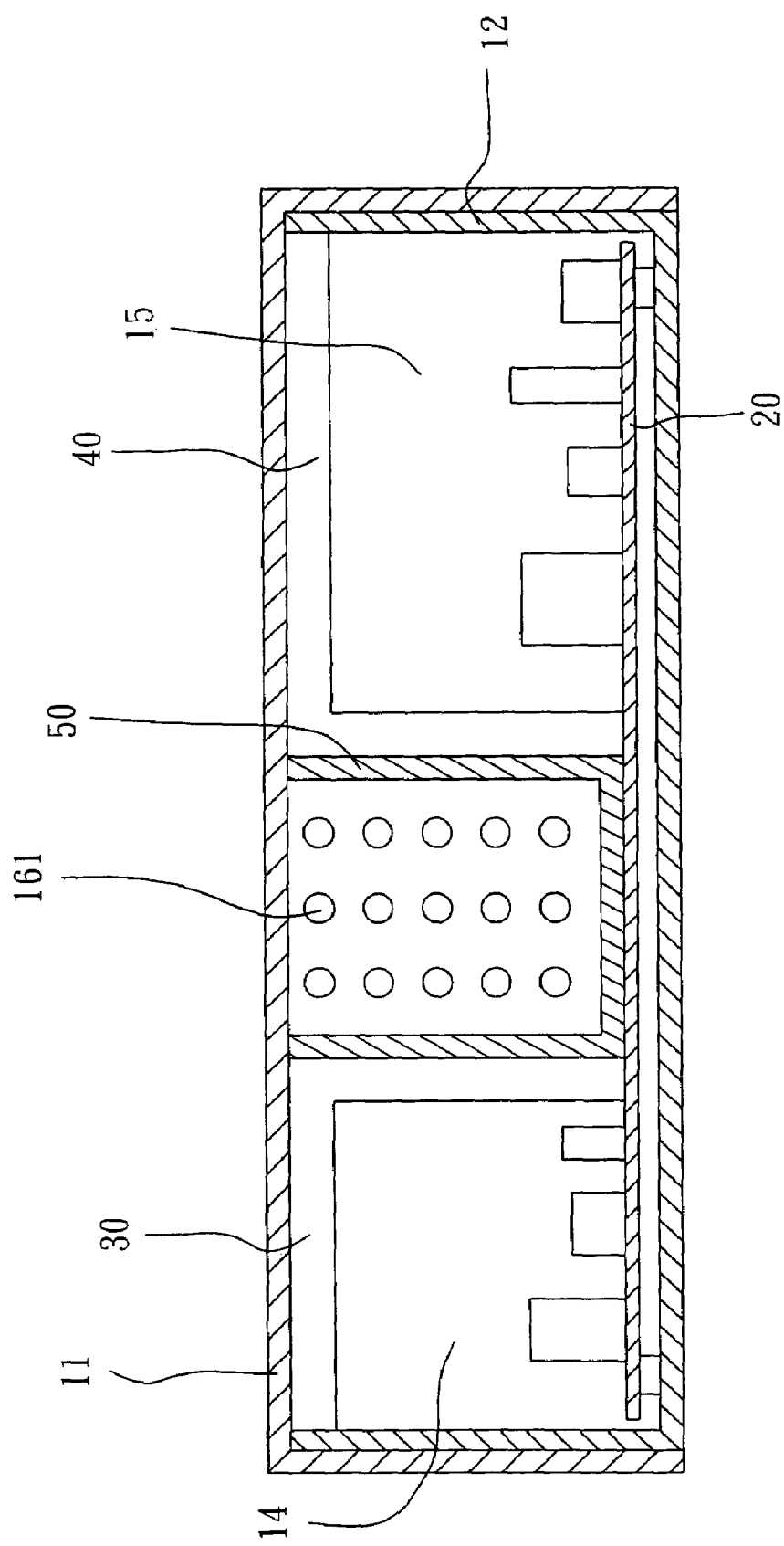
FIG. 4 is a sectional side plain view of the power adapter according to the present invention.

Referring to FIG. 4, during operation of the power adapter, the first heat sink 30 absorbs heat from the electronic component parts of the printed circuit board 20 in the first accommodation chamber 14, the second heat sink 40 absorbs heat from the electronic component parts of the printed circuit board 20 in the second accommodation chamber 15, and outside cold air is circulating through the air vents 16 to carry heat away from the first heat sink 30 and the second heat sink 40. As indicated above, the power adapter has an air passage 13 extending across the bottom cover shell 12 and air vents 161 formed on the top cover shell 11 corresponding to the air passage 13, therefore outside cooling air can circulate through the housing 10 to carry heat away from the first heat sink 30 and the second heat sink 40. Therefore, it is not necessary to use a cooling fan at the secondary side.

A prototype of power adapter has been constructed with the features of FIGS. 2~4. The power adapter functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A power adapter comprising:

a housing, said housing comprising a bottom cover shell and a top cover shell covering said bottom cover shell, said bottom cover shell having an inside space and an air passage extending through two opposite sides thereof and dividing said inside space into a first accommodation chamber and a second accommodation chamber, said top cover shell having at least one exhaust port adapted to guide circulation of outside cooling air through said air passage;

a printed circuit board mounted in said inside space inside said bottom cover shell of said housing and carrying a set of electronic component parts;

a first heat dissipation means mounted in said first accommodation chamber;

a second heat dissipation means mounted in said second accommodation chamber; and a spacer mounted in said air passage and tightly set between said first heat dissipation means and said second heat dissipation means;

wherein said first heat dissipation means and said second heat dissipation means respectively absorb heat from the electronic component parts of said printed circuit board in said first accommodation chamber and said second accommodation chamber for enabling absorbed heat to be carried to the outside of said housing by outside cooling air passing through said at least one exhaust port and said air passage; and said first accommodation chamber is smaller than said second accommodation chamber.

2. The power adapter as claimed in claim 1, wherein said air passage extending longitudinally through two opposite sides of said bottom cover shell.

3. The power adapter as claimed in claim 2, wherein said at least one exhaust port comprises a plurality of air vents on top and two opposite lateral sides of said top cover shell.

4. The power adapter as claimed in claim 3, wherein said spacer, said first heat dissipation means and said second heat dissipation means are tightly abutted against one another to block the inside space of said bottom cover shell and to protect said printed circuit board against outside dust and water.

5. The power adapter as claimed in claim 1, wherein said first heat dissipation means and said second heat dissipation means are heat sinks, and the size of said first heat dissipation means is greater than said second heat dissipation means.

6. The power adapter as claimed in claim 1, wherein said printed circuit board has a primary side received in said first accommodation chamber and a secondary side received in said second accommodation chamber.

7. The power adapter as claimed in claim 1, wherein said spacer is made of Mylar.

8. The power adapter as claimed in claim 1, wherein said first heat dissipation means covering tightly said first accommodation chamber; said second heat dissipation means covering tightly said second accommodation chamber.

9. The power adapter as claimed in claim 1, wherein a cross-section of said spacer has a U-shaped profile.

* * * * *